(12) United States Patent
Lin (10) Patent No.: US 12,237,454 B2
(45) Date of Patent: Feb. 25, 2025

(54) ELECTRONIC DEVICE AND MANUFACTURING METHOD THEREOF

(71) Applicant: InnoLux Corporation, Miao-Li County (TW)

(72) Inventor: Ming-Chang Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 564 days.

(21) Appl. No.: 17/529,166

(22) Filed: Nov. 17, 2021

(65) Prior Publication Data

US 2022/0199875 A1 Jun. 23, 2022

(30) Foreign Application Priority Data

Dec. 17, 2020 (CN) .......................... 202011496251.5

(51) Int. Cl.
*H01L 33/62* (2010.01)
*H01L 33/00* (2010.01)

(52) U.S. Cl.
CPC ............ *H01L 33/62* (2013.01); *H01L 33/005* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2014/0239494 A1 | 8/2014 | Chen | |
| 2018/0287098 A1* | 10/2018 | Hu | ........................ H10K 59/879 |
| 2020/0357971 A1* | 11/2020 | Lin | .......................... H01L 24/13 |
| 2022/0068872 A1* | 3/2022 | Hsu | .......................... H01L 24/16 |

FOREIGN PATENT DOCUMENTS

CN 110085732 A 8/2019

\* cited by examiner

*Primary Examiner* — Anthony Ho
(74) *Attorney, Agent, or Firm* — Winston Hsu (57) ABSTRACT

An electronic device and a manufacturing method thereof are disclosed. The manufacturing method of the electronic device includes following steps: providing a substrate; forming a first compressible layer on the substrate; forming a first bonding pad on the first compressible layer; providing an electronic component; forming a second bonding pad on the electronic component; and bonding the electronic component with the substrate by contacting the second bonding pad with the first bonding pad.

7 Claims, 4 Drawing Sheets

ELECTRONIC DEVICE AND MANUFACTURING METHOD THEREOF

BACKGROUND OF THE DISCLOSURE

1. Field of the Disclosure

The present disclosure relates to an electronic device and a manufacturing method thereof, and more particularly to an electronic device including a compressible layer and a manufacturing method thereof.

2. Description of the Prior Art

In the bonding process of electronic devices, a large number of small electronic components may be transferred and bonded to the substrate of electronic device. In this case, the uniform thickness of the bonding pads or the same height of the bonding surfaces is required for appropriately contacting the bonding pads of the electronic components with the bonding pads on the substrate. However, since the thicknesses of the bonding pads of electronic components or the bonding pads on the substrate may be deviated in the manufacturing process, or the positions of the bonding pads may be deviated while disposing the electronic components, the bonding surfaces of the bonding pads of the electronic components or the substrate may be located at different heights, thus the bonding pads of electronic components may not appropriately contact the bonding pads on the substrate, thereby resulting in poor bonding effect.

SUMMARY OF THE DISCLOSURE

An embodiment of the present disclosure provides a manufacturing method of an electronic device including following steps: providing a substrate; forming a first compressible layer on the substrate; forming a first bonding pad on the first compressible layer; providing an electronic component; forming a second bonding pad on the electronic component; and bonding the electronic component with the substrate by contacting the second bonding pad with the first bonding pad.

An embodiment of the present disclosure provides a manufacturing method of an electronic device including following steps: providing a substrate; forming a first bonding pad on the substrate; providing an electronic component; forming a second compressible layer on the electronic component; forming a second bonding pad on the second compressible layer; and bonding the electronic component with the substrate by contacting the first bonding pad with the second bonding pad.

An embodiment of the present disclosure provides an electronic device including a substrate, an electronic component, and a bonding structure. The bonding structure is disposed between the electronic component and the substrate, and the bonding structure includes a bonding layer and at least one compressible layer.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It should be understood that when a component or layer is referred to as being "on", "disposed on" or "connected to" another component or layer, it may be directly on or directly connected to the other component or layer, or intervening components or layers may be presented (indirect condition). In contrast, when a component is referred to as being "directly on", "directly disposed on" or "directly connected to" another component or layer, there are no intervening components or layers presented.

The electrical connection may be direct connection or indirect connection. When two components are electrically connected, the electrical signals may be transmitted by direct contact, and there are no other components presented between the two components. When two components are electrically connected, the electrical signals may be transmitted through the intermediate component bridging the two components.

Although terms such as first, second, third, etc., may be used to describe diverse constituent components, such constituent components are not limited by the terms. The terms are used only to discriminate a constituent component from other constituent components in the specification. The claims may not use the same terms, but instead may use the terms first, second, third, etc. with respect to the order in which a component is claimed. Accordingly, in the following description, a first constituent component may be a second constituent component in a claim.

It should be noted that the technical features in different embodiments described in the following can be replaced, recombined, or mixed with one another to constitute another embodiment without departing from the spirit of the present disclosure.

The electronic device of the present disclosure may include a display device, an antenna device, a sensing device, or a tiled device, but not limited herein. The electronic device may be a bendable or flexible electronic device. The electronic device may include light-emitting diodes, liquid crystal, fluorescence, phosphors, other suitable display media or combinations of the above, but not limited herein. The light-emitting diodes may, for example, include organic light-emitting diodes (OLEDs), inorganic light-emitting diodes (LEDs), mini-light-emitting diodes (mini LEDs, millimeter sized LEDs), micro-light-emitting diodes (micro-LEDs, micrometer sized LEDs), quantum dots (QDs) light-emitting diodes (e.g. QLEDs or QDLEDs), other suitable light-emitting diodes or any combination of the above, but not limited herein.

The antenna devices may be, for example, liquid crystal antennas or other types of antennas, but not limited herein. The antenna devices may, for example, include tiled antenna devices, but not limited herein. It should be noted that, the electronic device may also be any arrangement and combinations of the devices describe above, but not limited herein. In addition, the appearance of the electronic device may be rectangular, circular, polygonal, a shape with curved edges or other suitable shapes. The electronic device may have peripheral systems such as a driving system, a control system, a light source system, a shelf system, etc. to support a display device, an antenna device or a tiled device. Hereinafter, the display device will be used as an electronic device to illustrate the present disclosure, but the present disclosure is not limited thereto.

A direction X and a direction Z are marked in the following figures. A direction Z may be perpendicular to the top surface or bottom surface of the substrate 100, a direction X may be parallel to the top surface or bottom surface of the substrate 100, and the direction Z may be perpendicular to the direction X. The direction X and direction Z can be used to describe the spatial relationship of structures in following figures.

Figure 1:
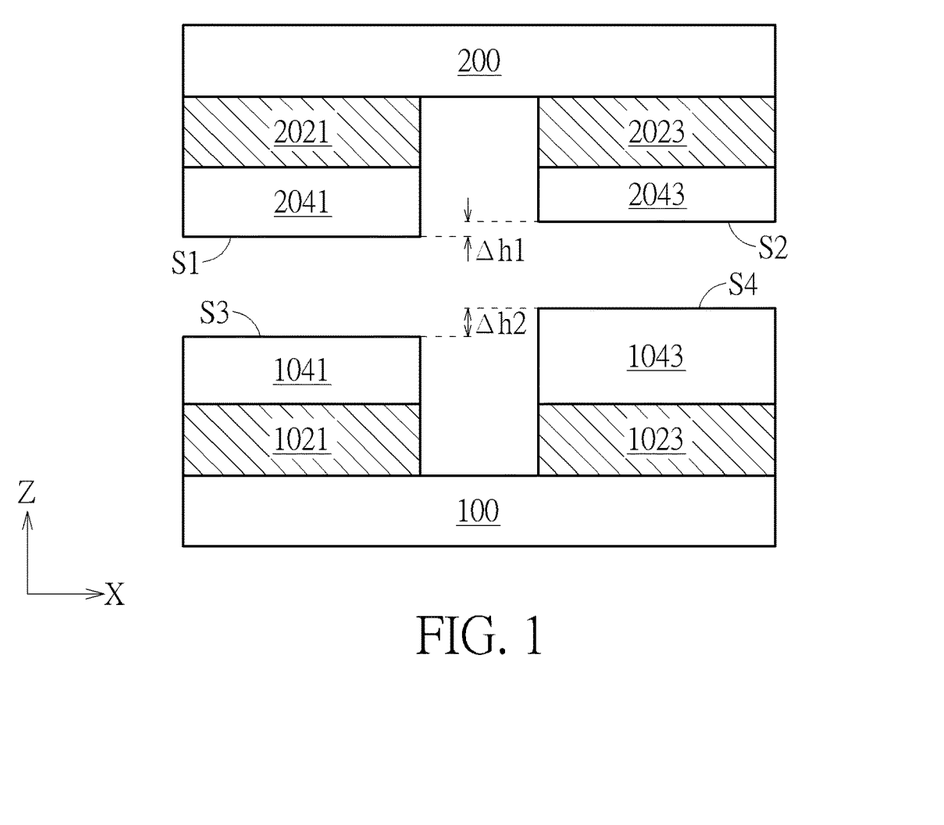
FIG. 1 is a schematic diagram of a side view of an electronic device before bonding according to a first embodiment of the present disclosure.
Figure 2:
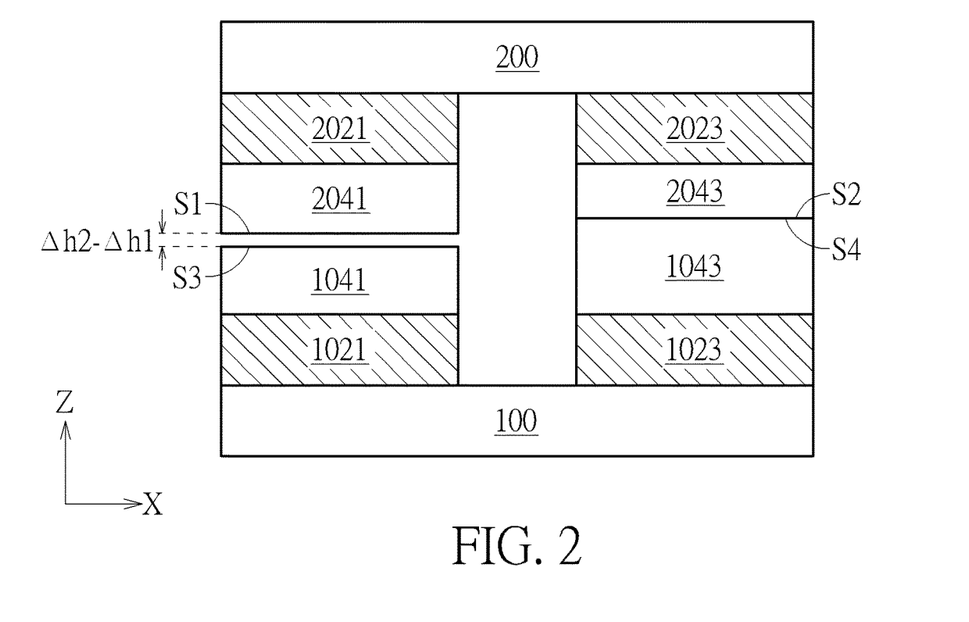
FIG. 2 is a schematic diagram of a side view of the electronic device before compressing according to the first embodiment of the present disclosure.
Figure 3:
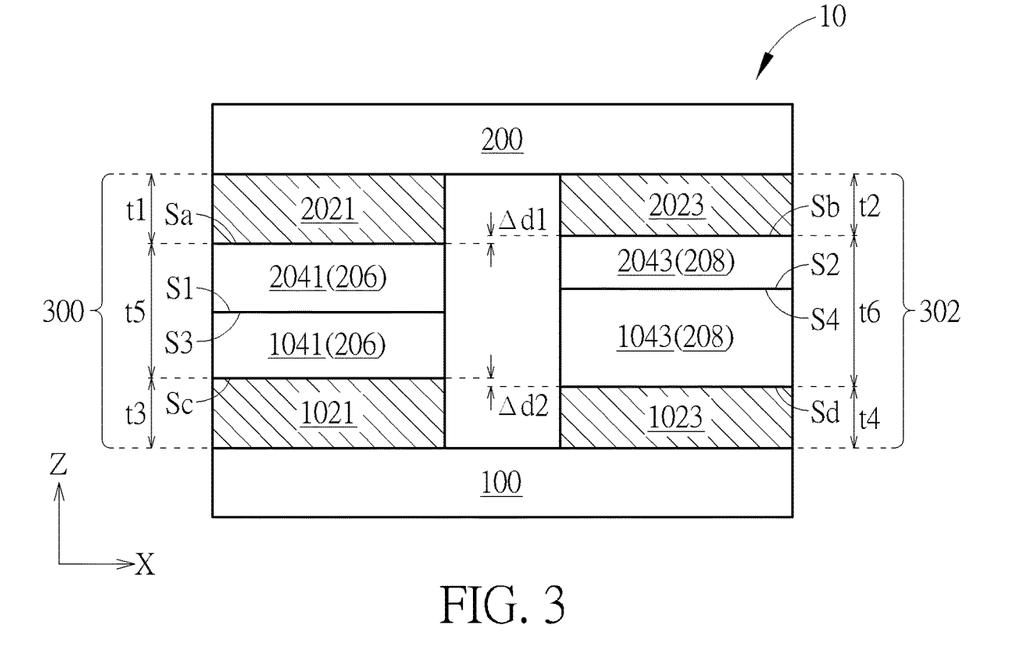
FIG. 3 is a schematic diagram of a side view of the electronic device after bonding according to the first embodiment of the present disclosure.

Please refer to FIG. 1 to FIG. 3, FIG. 1 is a schematic diagram of a side view of an electronic device before bonding according to a first embodiment of the present disclosure, FIG. 2 is a schematic diagram of a side view of the electronic device before compressing according to the first embodiment of the present disclosure, and FIG. 3 is a schematic diagram of a side view of the electronic device after bonding according to the first embodiment of the present disclosure. As shown in FIG. 1, a substrate 100 is provided. The substrate 100 may include a flexible substrate, an inflexible substrate, or a combination of the above, but not limited herein. In some embodiments, the material of the substrate 100 may include glass, ceramic, quartz, sapphire, acrylic, polyimide (PI), polyethylene terephthalate (PET), polycarbonate (PC), polyethersulfone (PES), polybutylene terephthalate (PBT), polyethylene naphthalate (PEN) or polyarylate (PAR), other suitable materials or combinations of the above, but not limited herein.

Different kinds of electronic components may be disposed on the substrate 100, such as integrated circuits (IC), thin film transistors, conductive pads, wires or combinations of the above, but not limited herein. The substrate 100 may be an active matrix substrate or a thin film transistor substrate, but not limited herein. In order to make the drawings simpler or clearer, some electronic components or insulating layers mentioned above are omitted in the drawings of the present disclosure.

As shown in FIG. 1, one or more first compressible layers are formed on the substrate 100, and a Young's modulus of the compressible layer may be less than or equal to 120 GPa. In addition, the compressible layer is conductive, and the compressible layer may be used to block the diffusion of metal atoms or increase adhesion. A compressible layer 1021 and a compressible layer 1023 may be formed on the substrate 100. The compressible layer 1021 and the compressible layer 1023 may be regarded as two portions of a first compressible layer. The compressible layer in the present disclosure may include a low hardness metal or alloy thereof, and the Young's modulus of the low hardness metal or alloy thereof may be less than or equal to 120 GPa. For example, the material of the compressible layer may include, lead, tin, gallium, indium, magnesium, zinc, aluminum, copper, silver, gold, combinations of the above materials, alloys of the above materials or alloys of the above material combinations, but not limited herein.

In addition, the material of the compressible layer in the present disclosure may also include a mixture of non-conductive resin or polymer and conductive metal particles, but not limited herein. The resin or polymer may be elastic and compressible. For example, the resin or polymer may include epoxy, acrylic, siloxane, polyimide (PI) or combinations of the above, but not limited herein. The compressible layer can be conductive since the metal particles are conductive. For example, the conductive metal particles may be micrometer-sized or nanometer-sized particles, but not limited herein. For example, the conductive metal particles may include particles of copper, silver, gold, tin, bismuth, combinations of the above materials, alloys of the above materials, or alloys of the above material combinations, but not limited herein. Or, the above metal or alloy can be coated outside elastic particles, such as anisotropic conductive film (ACF) particles, but not limited herein.

As shown in FIG. 1, a first bonding pad is formed on the first compressible layer. A bonding pad 1041 and a bonding pad 1043 may be respectively used as the first bonding pads, or the bonding pad 1041 and the bonding pad 1043 may be regarded as two portions of the first bonding pad. The bonding pad 1041 may be formed on the compressible layer 1021 and the bonding pad 1043 may be formed on the compressible layer 1023, thus the compressible layer 1021 may be disposed between the bonding pad 1041 and the substrate 100, and the compressible layer 1023 may be disposed between the bonding pads 1043 and the substrate 100. In some embodiments, the material of the bonding pad 1041 and the bonding pad 1043 may be different from the material of the compressible layer 1021 and the compressible layer 1023, but not limited herein. For example, the hardness of the material of the bonding pad 1041 and the bonding pad 1043 may be greater than the hardness of the material of the compressible layer 1021 and the compressible layer 1023.

On the other hand (as shown in FIG. 1), one or more electronic components 200 may be provided. For example, the electronic components 200 may include light emitting components, but not limited herein. The light emitting component may include a light-emitting diode (LED), and the light-emitting diode may include a mini-light-emitting diode (mini LED, millimeter sized LED), a micro-light-emitting diode (micro-LED, micrometer sized LED), a quantum dots (QDs) light-emitting diode (e.g. QLED or QDLED), other suitable light-emitting diodes or any combination of the above, but not limited herein.

In addition, a light conversion material may be disposed on the light emitting diode in some embodiments. For example, the light conversion materials may include quantum dot (QD) materials, fluorescence materials, color filter (CF) materials, phosphor materials, other suitable light conversion materials or combinations of the above, but not limited herein. In some embodiments, the light conversion material may cover the light emitting diode or may be disposed corresponding to the light emitting diode.

As shown in FIG. 1, one or more second compressible layers are formed on the electronic component 200. A compressible layer 2021 and a compressible layer 2023 may be formed on the electronic component 200. The compressible layer 2021 and the compressible layer 2023 may be regarded as two portions of a second compressible layer. In some embodiments (as shown in FIG. 1), the material of the compressible layer 1021 and the compressible layer 1023 may be the same as the material of the compressible layer 2021 and the compressible layer 2023, but not limited herein.

As shown in FIG. 1, a second bonding pad is formed on the second compressible layer, or the second compressible layer is formed between the electronic component and the second bonding pad. A bonding pad 2041 and a bonding pad 2043 may be respectively used as the second bonding pads, or the bonding pad 2041 and the bonding pad 2043 may be regarded as two portions of the second bonding pad. The bonding pad 2041 may be formed on the compressible layer 2021 and the bonding pad 2043 may be formed on the compressible layer 2023, the compressible layer 2021 may be disposed between the bonding pad 2041 and the electronic component 200, and the compressible layer 2023 may be disposed between the bonding pad 2043 and the electronic component 200. In some embodiments, the material of the bonding pad 2041 and the bonding pad 2043 may be different from the material of the compressible layer 2021 and the compressible layer 2023, but not limited herein. For example, the hardness of the material of the bonding pad 2041 and the bonding pad 2043 may be greater than the hardness of the material of the compressible layer 2021 and the compressible layer 2023.

In the present disclosure, the first bonding pad and the second bonding pad may include metals that can be used for diffusion bonding. The materials of the first bonding pad and the second bonding pad may include copper when the first bonding pad and the second bonding pad are used for low-temperature bonding, but not limited herein. The materials of the first bonding pad and the second bonding pad may include gold when the processing temperature is high, but not limited herein. In some embodiments (as shown in FIG. 1), the material of the first bonding pad and the material of the second bonding pad may be the same, but not limited herein. For example, the material of the first bonding pad and the material of the second bonding pad may include copper in this embodiment, but not limited herein.

Next, the electronic component 200 is bonded with the substrate 100 by contacting the second bonding pad with the first bonding pad. In the present disclosure, the second bonding pad and the first bonding pad may be bonded by solid diffusion. As shown in FIG. 1, the bonding pad 2041 may be contacted with the bonding pad 1041, and the bonding pad 2043 may be contacted with the bonding pad 1043. Next, at a suitable temperature and a suitable pressure, the bonding pad 2041 and the bonding pad 1041 may be bonded by solid diffusion, and the bonding pad 2043 and the bonding pad 1043 may be bonded by solid diffusion.

In the present disclosure, since the size of electronic component 200 (such as the micro-light-emitting diode) to be bonded is small, the distance between P/N contacts used for bonding is short as well. If the method of melting the solder is used for bonding, the flowable melted solder may cause the P/N contacts of the electronic component 200 to be electrical short, thereby decreasing the qualification rate of the electronic devices. However, even if the size of the electronic component 200 is small, the second bonding pad and the first bonding pad are bonded by solid diffusion in the present disclosure, thus the above problems can be avoided, and the qualification rate of electronic devices can be increased.

Since the first bonding pad and the second bonding pad are required to contact each other for proceeding the solid diffusion, the first bonding pad and/or the second bonding pad are required to have the same thickness, or the bonding surfaces of the first bonding pads are required to be located at the same height, or the bonding surfaces of the second bonding pads are required to be located at the same height, so that the first bonding pads and the second bonding pads can be appropriately contacted.

However, since the thicknesses of the bonding pads of the substrate 100 or the electronic components 200 may be deviated during the manufacturing process, or the positions of the bonding surfaces of the bonding pads may be deviated while disposing the electronic components 200, some of the first bonding pads or some of the second bonding pads may have different thicknesses, or the bonding surfaces of some of the first bonding pads may be located at different heights, or the bonding surfaces of some of the second bonding pads may be located at different heights. The above situations may cause some of the first bonding pads and some of the second bonding pads to be unable to contact each other, thus causing poor bonding effect.

In some embodiments, the first bonding pad may include at least two portions with different thicknesses (e.g., the bonding pad 1041 and/or the bonding pad 1043), and the two portions with different thicknesses can be contacted with the second bonding pad (e.g., the bonding pad 2041 and/or the bonding pad 2043) by compressing the compressible layer (e.g., the compressible layer 1021 and/or the compressible layer 1023). In other embodiments, the second bonding pad may include at least two portions with different thicknesses (e.g., the bonding pad 2041 and/or the bonding pad 2043), and the two portions with different thicknesses can be contacted with the first bonding pad (e.g., the bonding pad 1041 and/or the bonding pad 1043) by compressing the compressible layer (e.g., the compressible layer 2021 and/or the compressible layer 2023). In some embodiments, the bonding pad (e.g., the first bonding pad or the second bonding pad) including two portions with different thicknesses may be two bonding pads having two different thicknesses or one bonding pad having two different thicknesses.

For example, as shown in FIG. 1, the second bonding pad may include two portions with different thicknesses. For example, the bonding pad 2041 and the bonding pad 2043 may have different thicknesses. Therefore, a bonding surface S1 of the bonding pad 2041 and a bonding surface S2 of the bonding pad 2043 may be located at different heights (such as the heights in the direction Z), and a distance $\Delta h1$ may be included between the bonding surface S1 and the bonding surface S2. In addition, the first bonding pad may include two portions with different thicknesses. For example, the bonding pad 1041 and the bonding pad 1043 may have different thicknesses. Therefore, a bonding surface S3 of the bonding pad 1041 and a bonding surface S4 of the bonding pad 1043 may be located at different heights, and a distance Δh2 may be included between the bonding surface S3 and the bonding surface S4.

If the distance Δh1 is different from the distance Δh2, the first bonding pad may not contact with the second bonding pad. As shown in FIG. 2, the bonding surface S1 may not contact with the bonding surface S3 when the distance Δh2 is larger than the distance Δh1 and when the bonding surface S2 is contacted with the bonding surface S4.

However, in the present disclosure, the step of contacting the first bonding pad with the second bonding pad may include compressing the compressible layer. As shown in FIG. 3, since the compressible layer is disposed on the substrate 100 and/or the electronic component 200, a force may be applied to the substrate 100 and/or the electronic component 200 to compress the compressible layer, and the first bonding pad may be contacted with the second bonding pad through the deformation of the compressible layer. As shown in FIG. 3, a thickness t2 of the compressible layer 2023 may be less than a thickness t1 of the compressible layer 2021 after the compressible layer 2023 is compressed, and a thickness t4 of the compressible layer 1023 may be less than a thickness t3 of the compressible layer 1021 after the compressible layer 1023 is compressed. In addition, a distance Δd1 may be included between a surface Sa of the compressible layer 2021 and a surface Sb of the compressible layer 2023, and a distance Δd2 may be included between a surface Sc of the compressible layer 1021 and a surface Sd of the compressible layer 1023.

After the compressible layer 1023 and the compressible layer 2023 are compressed, the bonding surface S1 of the bonding pad 2041 can be appropriately contacted with the bonding surface S3 of the bonding pad 1041 when the sum of the distance Δd1 and the distance Δd2 in FIG. 3 is equal to the difference between the distance Δh2 and the distance Δh1 in FIG. 2 (Δd1+Δd2=Δh2−Δh1). Then, at a suitable temperature and a suitable pressure, the bonding pad 2041 and the bonding pad 1041 can be bonded by solid diffusion, and the bonding pad 2043 and the bonding pad 1043 can be bonded by solid diffusion.

In the present disclosure, the second bonding pads on the electronic components 200 can be contacted with the first bonding pads on the substrate 100 appropriately when a plurality of small electronic components 200 are required to be bonded to the substrate 100 by solid diffusion, thereby improving the effect of diffusion bonding.

As shown in FIG. 3, the present disclosure provides an electronic device 10 including the substrate 100, the electronic component 200 and the bonding structure (such as a bonding structure 300 or a bonding structure 302). The bonding structure 300 and the bonding structure 302 may be disposed between the electronic component 200 and the substrate 100. The bonding structure may include a bonding layer and at least one compressible layer. In some embodiments (as shown in FIG. 3), the bonding structure may include a plurality of compressible layers. Taking the bonding structure 300 as an example, the bonding structure 300 may include a bonding layer 206, the compressible layer 1021 and the compressible layer 2021. Taking the bonding structure 302 as an example, the bonding structure 302 may include a bonding layer 208, the compressible layer 1023, and the compressible layer 2023. The bonding layer 206 may be formed by bonding the bonding pad 1041 and the bonding pad 2041 in FIG. 1 through solid diffusion, and the bonding layer 208 may be formed by bonding the bonding pad 1043 and the bonding pad 2043 in FIG. 1 through solid diffusion.

In the present disclosure, the thickness or height may be measured from the cross-sectional image of an electron microscope, but not limited herein. When the first bonding pad and the second bonding pad are bonded, no obvious boundary may be included between the bonding pad 1041 and the bonding pad 2041 or between the bonding pad 1043 and the bonding pad 2043 in the cross-sectional image of the electron microscope. When other sub-films are included in the first bonding pad and the second bonding pad, a boundary may be included between the bonding pad 1041 and the bonding pad 2041 or a boundary may be included between the bonding pad 1043 and the bonding pad 2043 in the cross-sectional image of the electron microscope.

As shown in FIG. 3, a thickness t6 of the bonding layer 208 in the bonding structure 302 may be greater than a thickness t5 of the bonding layer 206 in the bonding structure 300; the thickness t2 of the compressible layer 2023 in the bonding structure 302 may be less than the thickness t1 of the compressible layer 2021 in the bonding structure 300; and the thickness t4 of the compressible layer 1023 in the bonding structure 302 may be less than the thickness t3 of the compressible layer 1021 in the bonding structure 300.

In some embodiments (as shown in FIG. 2), even if the bonding surface S1 of the bonding pad 2041 cannot be contacted with the bonding surface S3 of the bonding pad 1041 when the thicknesses of the bonding pad 1041 and the bonding pad 1043 are different and the thicknesses of the bonding pad 2041 and the bonding pad 2043 are different, the bonding surface S1 of the bonding pad 2041 can still be contacted with the bonding surface S3 of the bonding pad 1041 by compressing the compressible layer 2023 and the compressible layer 1023 (as shown in FIG. 3), thereby improving the effect of diffusion bonding. In some embodiments (as shown in FIG. 3), the material of the compressible layer 1021 and the compressible layer 1023 may be the same as the material of the compressible layer 2021 and the compressible layer 2023, but not limited herein.

Other embodiments of the present disclosure will be disclosed in the following. In order to simplify the illustration, the same elements in the following would be labeled with the same symbol. For clearly showing the differences between various embodiments, the differences between different embodiments are described in detail below, and repeated features will not be described redundantly. In addition, theses repeated features may be applied to various embodiments in the following.

Figure 4:
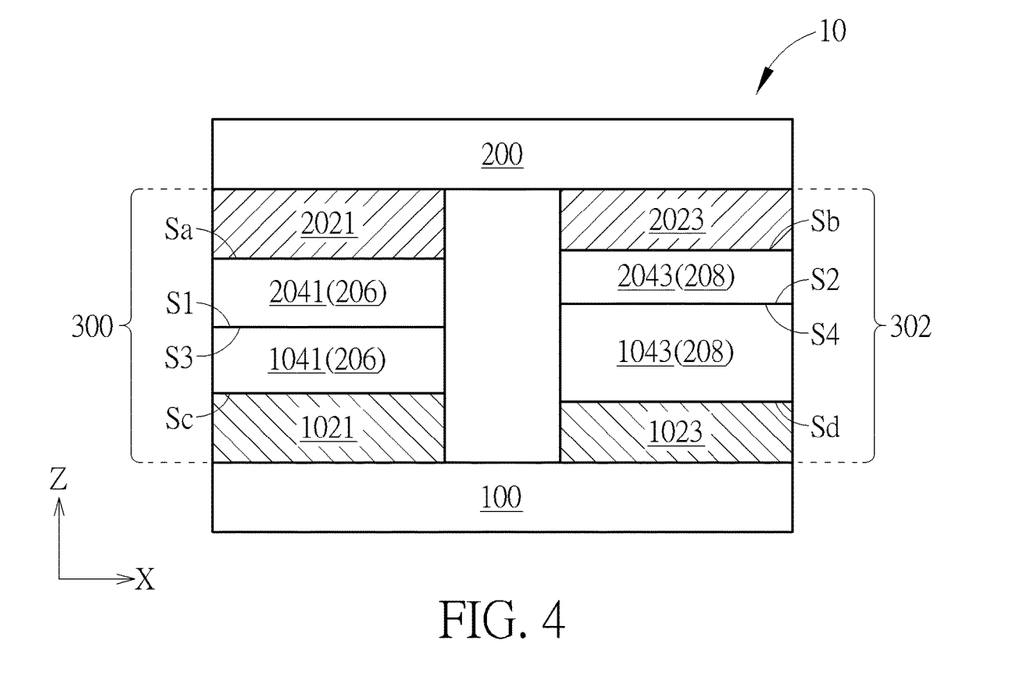
FIG. 4 is a schematic diagram of a side view of an electronic device after bonding according to a second embodiment of the present disclosure.

Please refer to FIG. 4, it is a schematic diagram of a side view of an electronic device after bonding according to a second embodiment of the present disclosure. Different from the first embodiment (as shown in FIG. 1 to FIG. 3), the material of the compressible layer 1021 and the compressible layer 1023 may be different from the material of the compressible layer 2021 and the compressible layer 2023 in some embodiments (as shown in FIG. 4). Compatible materials of the compressible layer 1021 and the compressible layer 2023 may be used according to the process performed on the substrate 100 to optimize the processes, or compatible materials of the compressible layer 2021 and the compressible layer 2023 may be used according to the process performed for manufacturing the electronic device 200 to optimize the processes. For example, the material of the compressible layer 1021 and the compressible layer 1023 may include low hardness metals or alloys thereof, and the material of the compressible layer 2021 and the compressible layer 2023 may include the mixture of non-conductive resin or polymer and conductive metal particles, but not limited herein.

Figure 5:
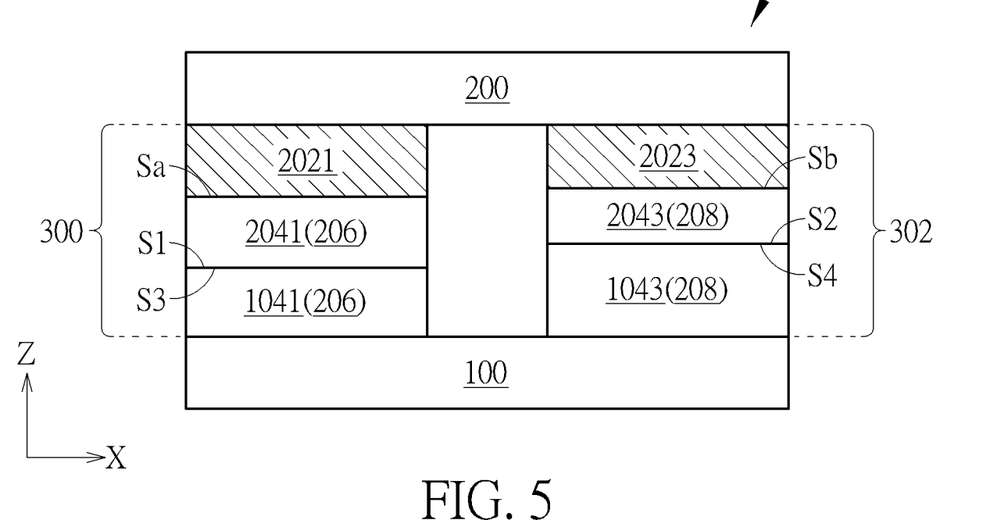
FIG. 5 is a schematic diagram of a side view of an electronic device after bonding according to a third embodiment of the present disclosure.

Please refer to FIG. 5, it is a schematic diagram of a side view of an electronic device after bonding according to a third embodiment of the present disclosure. Different from the first embodiment (as shown in FIG. 1 to FIG. 3), the compressible layer 2021 and the compressible layer 2023 may be formed on the electronic component 200, but the compressible layer may not be formed on the substrate 100 in some embodiments (as shown in FIG. 5), but not limited herein. Therefore, the bonding structure 300 and the bonding structure 302 may not include a compressible layer disposed between the bonding pad 1041 and the substrate 100 and between the bonding pad 1043 and the substrate 100, but not limited herein.

In some embodiments, the second bonding pad may include two portions with different thicknesses, and the first bonding pad may include two portions with different thicknesses. For example, the bonding pad 2041 and the bonding pad 2043 may have different thicknesses, and the bonding pad 1041 and the bonding pad 1043 may have different thicknesses. Therefore, the bonding surface S1 may not be contacted with the bonding surface S3 when the bonding surface S2 is contacted with the bonding surface S4. However, the bonding surface S1 of the bonding pad 2041 and the bonding surface S3 of the bonding pad 1041 can be appropriately contacted by compressing the compressible layer 2023 (as shown in FIG. 5), thereby improving the effect of diffusion bonding. For example (as shown in FIG. 5), the thickness of the compressible layer 2021 may be greater than the thickness of the compressible layer 2023, and the surface Sa of the compressible layer 2021 may be lower than the surface Sb of the compressible layer 2023 after the compressible layer 2023 is compressed.

In some embodiments (as shown in FIG. 5), since the compressible layer (such as the compressible layer 2021 and the compressible layer 2023) may only be formed on the electronic component 200, the mixture of resin or polymer and metal particles with higher elasticity may be used as the material of the compressible layer, but not limited herein.

Figure 7:
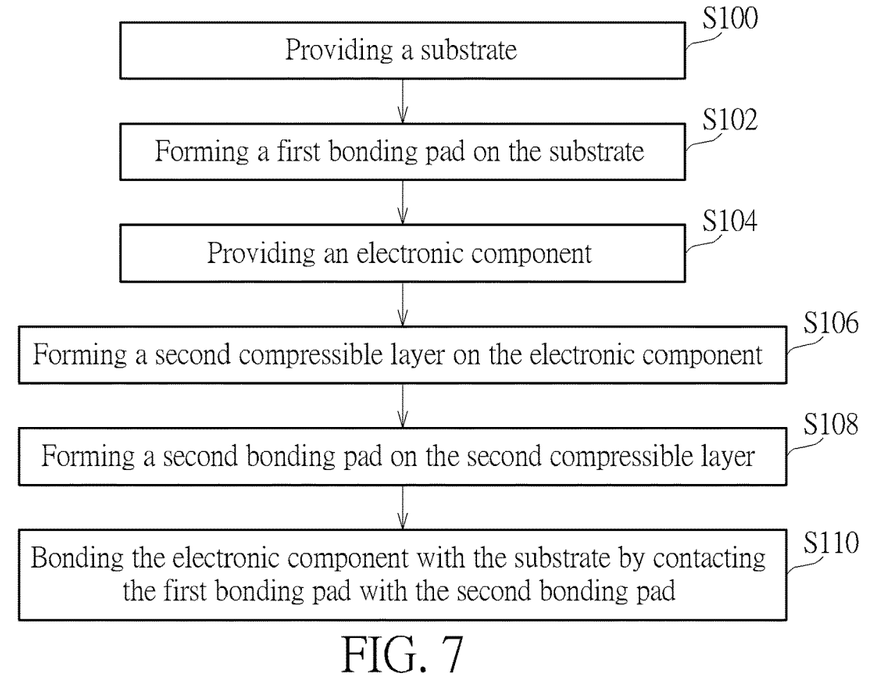
FIG. 7 is a flowchart of a manufacturing method of the electronic device of FIG. 5.

Please refer to FIG. 7, it is a flowchart of a manufacturing method of the electronic device of FIG. 5. In some embodiments (as shown in FIG. 5), the manufacturing method of the electronic device 10 may mainly include (but not limited to) the steps shown in FIG. 7:

Step S100: providing a substrate 100;

Step S102: forming a first bonding pad (e.g., the bonding pad 1041 or the bonding pad 1043) on the substrate 100;

Step S104: providing an electronic component 200;

Step S106: forming a second compressible layer (e.g., the compressible layer 2021 or the compressible layer 2023) on the electronic component 200;

Step S108: forming a second bonding pad (e.g., the bonding pad 2041 or the bonding pad 2043) on the second compressible layer; and Step S110: bonding the electronic component 200 with the substrate 100 by contacting the first bonding pad with the second bonding pad.

Figure 6:
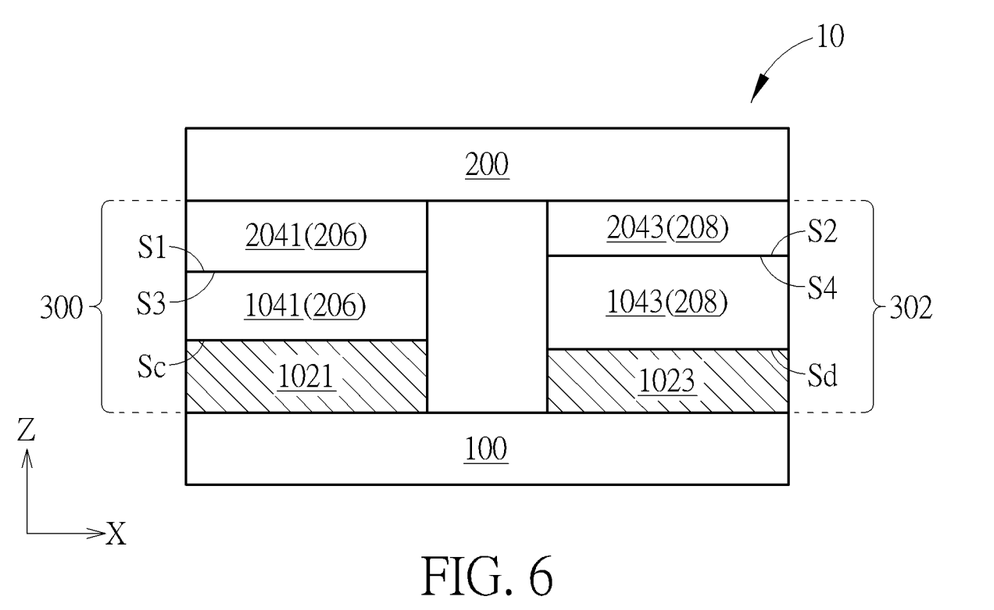
FIG. 6 is a schematic diagram of a side view of an electronic device after bonding according to a fourth embodiment of the present disclosure.

Please refer to FIG. 6, it is a schematic diagram of a side view of an electronic device after bonding according to a fourth embodiment of the present disclosure. Different from the first embodiment (as shown in FIG. 1 to FIG. 3), the compressible layer 1021 and the compressible layer 1023 may be formed on the substrate 100, but the compressible layer may not be formed on the electronic component 200 in some embodiments (as shown in FIG. 6), but not limited herein. Therefore, the bonding structure 300 and the bonding structure 302 may not include the compressible layer disposed between the electronic component 200 and the bonding pad 2041 and between the electronic component 200 and the bonding pad 2043, but not limited herein.

In some embodiments, the second bonding pad may include two portions with different thicknesses, and the first bonding pad may include two portions with different thicknesses. For example, the bonding pad 2041 and the bonding pad 2043 may have different thicknesses, and the bonding pad 1041 and the bonding pad 1043 may have different thicknesses. Therefore, the bonding surface S1 may not be contacted with the bonding surface S3 when the bonding surface S2 is contacted with the bonding surface S4. However, the bonding surface S1 of the bonding pad 2041 and the bonding surface S3 of the bonding pad 1041 can be appropriately contacted by compressing the compressible layer 1023 (as shown in FIG. 6), thereby improving the effect of diffusion bonding. For example (as shown in FIG. 6), the thickness of the compressible layer 1021 may be greater than the thickness of the compressible layer 1023, and the surface Sc of the compressible layer 1021 may be higher than the surface Sd of the compressible layer 1023 after the compressible layer 1023 is compressed.

In some embodiments (as shown in FIG. 6), since the compressible layer (such as the compressible layer 1021 and the compressible layer 1023) may only be formed on the substrate 100, the mixture of resin or polymer and metal particles with higher elasticity may be used as the material of the compressible layer, but not limited herein.

Figure 8:
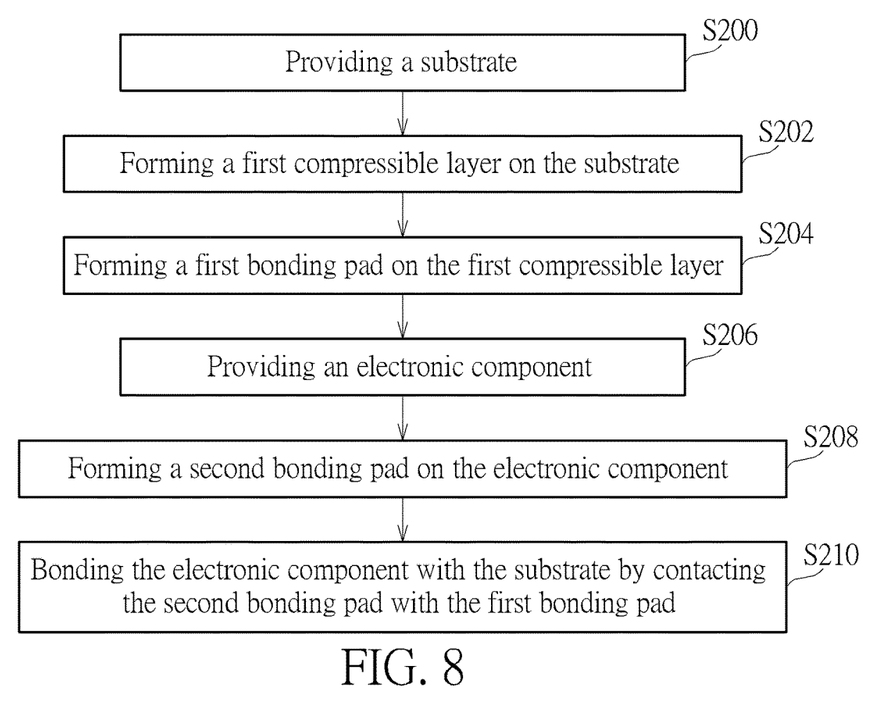
FIG. 8 is a flowchart of a manufacturing method of the electronic device of FIG. 6.

Please refer to FIG. 8, it is a flowchart of a manufacturing method of the electronic device of FIG. 6. In some embodiments (as shown in FIG. 6), the manufacturing method of the electronic device 10 may mainly include (but not limited to) the steps shown in FIG. 8:

Step S200: providing a substrate 100;

Step S202: forming a first compressible layer (e.g., the compressible layer 1021 or the compressible layer 1023) on the substrate 100;

Step S204: forming a first bonding pad (e.g., the bonding pad 1041 or the bonding pad 1043) on the first compressible layer;

Step S206: providing an electronic component 200;

Step S208: forming a second bonding pad (e.g., the bonding pad 2041 or the bonding pad 2043) on the electronic component 200; and Step S210: bonding the electronic component 200 with the substrate 100 by contacting the second bonding pad with the first bonding pad.

In addition, the material of the compressible layer may be selected according to the size of the component in the electronic device 10, such as the size of the electronic component 200. For example, the Young's modulus of the compressible layer may be about 10 GPa to about 120 GPa, and the compressible range of the thickness of the compressible layer may be about 1% to about 10% when the low hardness metal or alloy thereof is used as the compressible layer. For example, the thickness of the compressible layer may be at least 10 microns when the height difference to be compensated (or the compression amount of the compressible layer) is 1 micron and the compressible range of the compressible layer is 10%.

For example, the Young's modulus of the compressible layer may be about 1 GPa to about 70 GPa depending on the mixing amount of the metal particles, and the compressible range of the thickness of the compressible layer may be about 10% to about 50% when the mixture of resin or polymer and metal particles is used as the compressible layer. For example, the thickness of the compressible layer may be at least 2 microns when the height difference to be compensated (or the compression amount of the compressible layer) is 1 micron and the compressible range of the compressible layer is 50%. Therefore, the material of the compressible layer can be selected according to the size of the electronic component 200 and/or the size of the compressible layer in different product designs.

In the electronic device and the manufacturing method thereof of the present disclosure, the compressible layer may be formed on at least one of the substrate and the electronic component. Even if some of the first bonding pads may not be contacted with some of the second bonding pads due to the thickness deviation of the bonding pads on the electronic components or the substrate occurred in the manufacturing process, or due to the position deviation of the bonding surfaces of the bonding pads occurred in disposing the electronic components, a force may be applied to the substrate and/or electronic component to compress the compressible layer, and the first bonding pad may be appropriately contacted with the second bonding pad through the deformation of the compressible layer. Therefore, the effect of solid diffusion bonding between the first bonding pad and the second bonding pad can be improved, thereby improving the qualification rate of the electronic devices.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A manufacturing method of an electronic device, comprising:
   providing a substrate;
   forming a first compressible layer on the substrate;
   forming a first bonding pad on the first compressible layer;
   providing an electronic component;
   forming a second bonding pad on the electronic component; and
   bonding the electronic component with the substrate by contacting the second bonding pad with the first bonding pad,
   wherein a material of the first bonding pad and a material of the second bonding pad are the same.

2. The manufacturing method of the electronic device according to claim 1, further comprising forming a second compressible layer between the electronic component and the second bonding pad.

3. The manufacturing method of the electronic device according to claim 1, wherein the first bonding pad comprises two portions with different thicknesses, and the manufacturing method further comprises contacting the two portions with different thicknesses with the second bonding pad by compressing the first compressible layer.

4. The manufacturing method of the electronic device according to claim 1, wherein the material of the first bonding pad and the material of the second bonding pad comprise copper.

5. A manufacturing method of an electronic device, comprising:
   providing a substrate;
   forming a first bonding pad on the substrate;
   providing an electronic component;
   forming a second compressible layer on the electronic component;
   forming a second bonding pad on the second compressible layer; and
   bonding the electronic component with the substrate by contacting the first bonding pad with the second bonding pad,
   wherein a material of the first bonding pad and a material of the second bonding pad are the same.

6. The manufacturing method of the electronic device according to claim 5, wherein the second bonding pad comprises two portions with different thicknesses, and the manufacturing method further comprises contacting the two portions with different thicknesses with the first bonding pad by compressing the second compressible layer.

7. The manufacturing method of the electronic device according to claim 5, wherein the material of the first bonding pad and the material of the second bonding pad comprise copper.

* * * * *